United States Patent
Talayssat et al.

(10) Patent No.: US 7,917,819 B2
(45) Date of Patent: Mar. 29, 2011

(54) JTAG TEST ARCHITECTURE FOR MULTI-CHIP PACK

(75) Inventors: Jacky Talayssat, Chateauneuf (FR); Sake Buwalda, Antibes (FR)

(73) Assignee: NXP B.V., Eindhoven (NL)

( * ) Notice: Subject to any disclaimer, the term of this patent is extended or adjusted under 35 U.S.C. 154(b) by 1088 days.

(21) Appl. No.: 10/585,607

(22) PCT Filed: Jan. 5, 2005

(86) PCT No.: PCT/IB2005/000072
§ 371 (c)(1),
(2), (4) Date: Jul. 10, 2006

(87) PCT Pub. No.: WO2005/069025
PCT Pub. Date: Jul. 28, 2005

(65) Prior Publication Data
US 2008/0288839 A1    Nov. 20, 2008

(30) Foreign Application Priority Data
Jan. 13, 2004  (EP) .................................. 04300016

(51) Int. Cl.
*G01R 31/28* (2006.01)
(52) U.S. Cl. .......................... 714/727; 714/734
(58) Field of Classification Search .................. None
See application file for complete search history.

(56) References Cited

U.S. PATENT DOCUMENTS

| | | | |
|---|---|---|---|
| 5,043,986 A * | 8/1991 | Agrawal et al. | 714/736 |
| 5,491,666 A | 2/1996 | Sturges | |
| 5,625,631 A | 4/1997 | Zimmerman et al. | |
| 5,673,276 A | 9/1997 | Jarwala et al. | |
| 5,862,152 A | 1/1999 | Handly et al. | |
| 5,907,562 A * | 5/1999 | Wrape et al. | 714/726 |
| 6,032,278 A * | 2/2000 | Parvathala et al. | 714/726 |
| 6,094,056 A | 7/2000 | Bardsley et al. | |
| 6,397,361 B1 | 5/2002 | Saitoh | |
| 6,538,469 B1 | 3/2003 | Nguyen et al. | |
| 6,546,511 B1 | 4/2003 | Sim et al. | |
| 2003/0079166 A1 | 4/2003 | Vermeulen et al. | |

FOREIGN PATENT DOCUMENTS

GB    2379524 A    3/2003

OTHER PUBLICATIONS

Hilla, S. "Boundary Scan Testing for Multichip Modules", Proc. of the IEEE In'tl. Test Conf., pp. 224-231 (Sep. 1992).

* cited by examiner

Primary Examiner — Christine T Tu

(57) ABSTRACT

A test-communication path is provided between chips in a multi-chip package. Externally-accessible JTAG input and output pins are provided to a first chip in the multi-chip package, and this first chip is configured to allow signals received on these JTAG pins to be routed to other chips in the multi-chip package. Control signals provided to the first chip control the routing of the JTAG signals to each chip.

22 Claims, 1 Drawing Sheet

JTAG TEST ARCHITECTURE FOR MULTI-CHIP PACK

Figure 1:
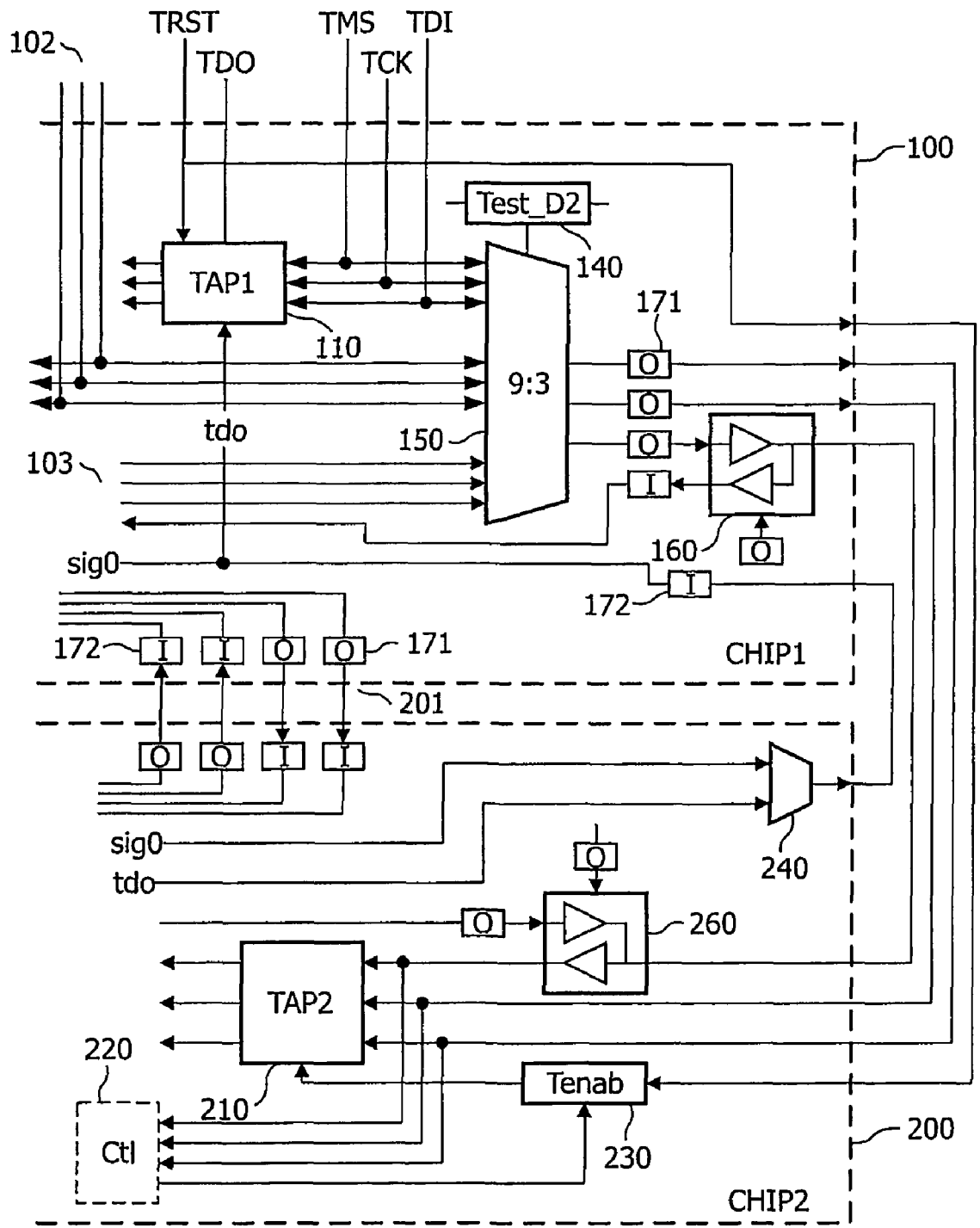

This invention relates to the field of electronic circuits and testing, and in particular to an architecture that facilitates JTAG testing of multi-chip packages (MCPs).

IEEE Standard 1149.1, Standard Test Access Port and Boundary Scan Architecture, specifies a technique for verifying the operation of integrated circuits by the use of digital full scan and boundary scan test at the production stage. This standard is also termed the JTAG standard, and the corresponding test procedure as JTAG testing. In accordance with this standard, boundary scan cells (BSC) are inserted on all function input/output (I/O) signals of the integrated circuit (IC), and scan multiplexers are inserted at each flip-flop of the IC. A Test Access Port (TAP) controller is configured to receive three control inputs (TDI, TMS, TCK) and a reset input (TRST), and to provide an output (TDO). The TAP controller receives the control inputs in accordance with a series of predefined test shells, loads the input boundary scan cells and flip-flops with a given test pattern, activates the logic devices within the IC to generate resultant signals in the output boundary scan cells and flip-flops, and outputs these resultant signals. These resultant signals are compared to a set of predefined fault-free outputs corresponding to the given test pattern; if the resultant signals do not match the predefined fault-free outputs, the IC is defective.

As electronic systems become more complex, multiple integrated circuits are required to perform a given function. To facilitate efficient packaging of the circuitry required to perform such complex functions, Multi-Chip Packages (MCP) have been developed, wherein a single package is configured to contain multiple integrated circuits. MCPs are commonly used, for example, for System on Chip (SoC) solutions for wireless communications. An MCP for BlueTooth (BT) wireless connectivity, for example, may contain a predominantly digital die that handles the BlueTooth baseband processing, and a predominantly analog die that handles the radio-frequency (RF) modulation and demodulation functions under digital control.

To comply with the IEEE 1149.1 standard, each chip in a multi-chip package that contains digital circuitry must be fully testable under this standard. However, the number of externally-accessible pins on a MCP is limited, and increasing the size of the MCP to accommodate additional pins has a direct impact on the overall cost of the MCP. In the aforementioned example of a BlueTooth MCP, the use of five pins for each of the two chips within the MCP is economically infeasible due to the competitive influences in this field. The infeasibility of five test pins per chip in an MCP will be further exacerbated in MCPs containing more than two chips.

It is an object of this invention to provide an architecture that facilitates JTAG testing in a multi-chip package. It is a further object of this invention to provide an architecture that facilitates JTAG testing in a multi-chip package that minimizes the number of externally-accessible pins required on the multi-chip package.

These objects and others are achieved by providing a test-communication path between chips in a multi-chip package. Externally-accessible JTAG input and output pins are provided to a first chip in the multi-chip package, and this first chip is configured to allow signals received on these JTAG pins to be routed to other chips in the multi-chip package. Control signals provided to the first chip control the routing of the JTAG signals to each chip.

Following are descriptions of illustrative embodiments of the present invention that, when taken in conjunction with the drawing will demonstrate the above noted features and advantages, as well as other features and advantages.

The drawing is included for illustrative purposes and is not intended to limit the scope of the invention. In the drawing:

FIG. 1 illustrates an example block diagram of a test architecture for JTAG testing of multiple integrated circuits in a multi-chip package in accordance with this invention.

FIG. 1 illustrates an example block diagram of a test architecture for JTAG testing of two integrated circuits 100, 200 in a multi-chip package in accordance with this invention. One of ordinary skill in the art will recognize that only the components necessary for understanding the concepts of this invention are illustrated, and that the integrated circuits 100, 200 will contain many other circuits and systems, and that many other interconnections 201 will typically exist between these integrated circuits.

The five conventional JTAG input and output pins, TMS, TDI, TCK, TRST, and TDO are illustrated in FIG. 1, operably coupled to a Test Access Port (TAP1) 110 in the first integrated circuit (IC) 100. TAP1 110 corresponds to a conventional test access port controller that is configured to control IC 100 during testing, and is configured to load test patterns into internal devices of IC 100, and to unload resultant signals out of IC 100, for comparison with predefined fault-free output signals. Illustrated in FIG. 1 are conventional input 172 and output 171 boundary scan cells that are controlled and scanned by the TAP1 110 in IC 100 and TAP 2 210 in IC 200 during JTAG testing. One of the other devices of IC 100 that TAP1 110 is configured to load during testing is a register Test_D2 140, which is a register that is configured to control the routing of signals from the JTAG input and output pins to the second IC 200.

Register Test_D2 140 in IC 100 controls a multiplexer 150 that selects one of three sets of inputs for routing to IC 200. In a first test mode, three general input/output (I/O) signals 102 are coupled via the multiplexer 150 to control logic 220 in the second IC 200. Based on commands sent via these general I/O signals 102, the control logic 220 enables the Test Access Port (TAP2) 210 of the IC 200 via the Tenab register 230. When the TAP2 210 is enabled, TAP1 110 in IC 100 places the Test_D2 register 140, and thereby the multiplexer 150, in a second test mode, wherein signals from the JTAG input pins TMS, TCK, TDI are coupled to the TAP2 210 in IC 200. Thereafter, the JTAG control inputs TMS, TCK, TDI are coupled to the TAP2 210 in IC 200 via IC 100, in the same manner as if TAP2 210 were directly connected to the JTAG input pins TMS, TCK, TDI, and the testing of IC 200 can be conducted in accordance with the JTAG standard.

An output signal sig0 of IC 200 is multiplexed with a test output signal tdo signal, at mux 240. When IC 200 is enabled for JTAG testing, the test output signal tdo is coupled via the mux 240 to IC 100, and TAP1 110 is configured to couple this output signal tdo to the JTAG output pin TDO from IC 100.

The JTAG reset pin TRST is continuously coupled to IC 200 via IC 100, and is configured to disable testing of IC 200 by resetting the Tenab register 230 in IC 200. Note that the above coupling of JTAG signals from IC 100 to IC 200 allows complete JTAG-compliant testing of IC 200 without requiring any additional externally-accessible pins on the multi-chip package. Note also that this architecture allows for more than two chips to be controlled by the one set of externally-accessible JTAG pins on the multi-chip package by merely providing different test-mode-enabling command sequences to enable each of the additional chips as required.

The JTAG reset also resets the Test_D2 register 140, placing the multiplexer 150 into its default state, wherein, optionally, internal signals 103 from IC 100 are coupled to IC 200.

In this manner, the three lines coupling IC 100 and IC 200 from the multiplexer 150 are not exclusively dedicated for test purposes; when IC 100 and IC 200 are not in a test mode, functional signals can be communicated via these three lines. In like manner, the three general I/O signals 102 that are used to provide the test-mode-enabling sequence can generally be any three input pins that have other functions during normal operations. In such an embodiment, the command sequence from the general I/O signals 102 that sets the Tenab register 230 should be defined as a sequence that the internal signals 103 and the selected I/O signals 102 cannot generate during normal operations. The use of such a unique test-mode-enabling sequence is common in the art, as are other techniques of enabling or pre-enabling a test-mode.

Note also that one of the three lines is illustrated as containing a bi-directional port 160, 260 at each of the ICs 100, 200, indicating that it can be used for communications from IC 200 to IC 100 as well as from IC 100 to IC 200. All of the JTAG input and output lines can be similarly configured for bidirectional operation.

The foregoing merely illustrates the principles of the invention. It will thus be appreciated that those skilled in the art will be able to devise various arrangements which, although not explicitly described or shown herein, embody the principles of the invention and are thus within its spirit and scope. For example, if the functional interface between IC 100 and IC 200 is processor controlled, the processor can be configured to place IC 200 in JTAG test mode, obviating the need for a test-mode-enabling sequence via the common I/O signals 102. In like manner, the processor interface can be configured to communicate the signals from the JTAG pins of IC 100 to the TAP2 of IC 200. These and other system configuration and optimization features will be evident to one of ordinary skill in the art in view of this disclosure, and are included within the scope of the following claims.

The invention claimed is:

1. A multi-chip system comprising:
a first integrated circuit that is coupled to externally-accessible test pins and
a second integrated circuit that is coupled to the first integrated circuit
wherein
the first integrated circuit is configured to provide a communication path to the second integrated circuit for forwarding test signals from the test pins to the second integrated circuit in a protocol format the same as a protocol format of the test signals received from the test pins.

2. The system of claim 1, further including
a multi-chip package that is configured to contain the first integrated circuit and the second integrated circuit.

3. The system of claim 1, wherein
the communication path includes
a multiplexer that is configured to communicate:
at least one of the test signals when the system is in a test mode, and
other signals when the system is an operational mode.

4. The system of claim 3, wherein
the multiplexer is further configured to communicate
a command sequence that is configured to enable the second integrated circuit for receiving the test signals.

5. The system of claim 1, wherein
the test pins correspond to JTAG test pins; and
the test signals include signals from a Test-mode-select (TMS) pin, a Test-clock (TCK) pin, and a Test-data-in (TDI) pin.

6. The system of claim 1, wherein
the first integrated circuit includes a first JTAG test access port
the second integrated circuit includes a second JTAG test access port
the test pins correspond to JTAG test pins that are coupled to the first JTAG test access port (110), and
the communications path couples the test signals on the JTAG test pins to the second JTAG test access port.

7. The system of claim 1, wherein
the first integrated circuit includes a processor, and
the communication path corresponds to an interface between the processor and the second integrated circuit.

8. The system of claim 1, wherein
the communication path includes at least one bidirectional path between the first integrated circuit and the second integrated circuit.

9. The system of claim 1, wherein
the second integrated circuit includes control logic that is configured to:
decode a command sequence communicated from the first integrated circuit and
place the second integrated circuit into a test mode for receiving the test signals, based on the command sequence.

10. A multi-chip system comprising:
a first integrated circuit that is coupled to externally-accessible test pins and
a second integrated circuit that is coupled to the first integrated circuit
wherein:
the first integrated circuit is configured to provide a communication path to the second integrated circuit for forwarding test signals from the test pins to the second integrated circuit in a protocol format the same as a protocol format of the test signals received from the test pins;
the second integrated circuit includes control logic that is configured to decode a command sequence communicated from the first integrated circuit, and place the second integrated circuit into a test mode for receiving the test signals, based on the command sequence;
the first integrated circuit is further configured to provide a reset-communication path to the second integrated circuit for forwarding a reset signal from the test pins to the second integrated circuit; and
the control logic is further configured to place the second integrated circuit into an operational mode in response to the reset signal.

11. The system of claim 1, wherein
the second integrated circuit includes scan test cells, and
the test signals are configured to apply a test pattern to the scan test cells and to provide resultant scan test output signals to at least one of the test pins.

12. The system of claim 1, wherein
the second integrated circuit includes boundary scan cells, and the test signals are configured to apply a test pattern to the boundary scan cells and to provide resultant boundary scan output signals to at least one of the test pins.

13. The multi-chip system of claim 1, further including
a third integrated circuit that is coupled to the first integrated circuit;

wherein the system is configured to communicate
- a first command sequence that selectably, and exclusively from a second command sequence, enables the second integrated circuit for receiving the test signals;
- the second command sequence, which selectably and exclusively from the first command sequence, enables the third integrated circuit for receiving the test signals; and
- wherein the first integrated circuit is configured to provide a respective communication path to each of the second and third integrated circuits for forwarding test signals from the test pins to the second integrated circuit in response to the respective integrated circuit being enabled by one of the first and second command sequences.

14. A method of testing a multi-chip system including:
placing a first integrated circuit into a first test mode,
placing a second integrated circuit into a second test mode,
communicating test signals to the first integrated circuit via externally-accessible test pins and
forwarding the test signals from the first integrated circuit to the second integrated circuit in a protocol format the same as a protocol format of the test signals received from the test pins.

15. The method of claim 14, wherein
placing the second integrated circuit into the second test mode includes communicating a test-mode-enabling command sequence from the first integrated circuit to the second integrated circuit.

16. The method of claim 15, wherein
placing the second integrated circuit into the second test mode includes enabling the multiplexer to route the test-mode-enabling command sequence from the first integrated circuit to the second integrated circuit.

17. The method of claim 14, wherein
communicating the test signals from the first integrated circuit includes enabling a multiplexer in the first integrated circuit to route at least one of the test signals from the externally-accessible test pins to the second integrated circuit.

18. The method of claim 17, wherein
the test-mode-enabling command sequence is provided from other externally-accessible pins coupled to the first integrated circuit.

19. The method of claim 17, further including
placing the first integrated circuit and the second integrated circuit into an operational mode, and
enabling the multiplexer to route other signals to the second integrated circuit.

20. The method of claim 14, wherein
the test pins correspond to JTAG test pins.

21. The method of claim 20, further including
applying a test pattern from at least one of the JTAG test pins to scan test cells in the second integrated circuit and
providing resultant test output signals from the second integrated circuit to at least one other of the JTAG test pins.

22. The method of claim 20, further including
applying a test pattern from at least one of the JTAG test pins to boundary scan cells in the second integrated circuit and
providing resultant test output signals from the second integrated circuit to at least one other of the JTAG test pins.

* * * * *